United States Patent
Ciou et al.

(10) Patent No.: US 12,127,335 B2
(45) Date of Patent: Oct. 22, 2024

(54) ELECTRONIC DEVICE

(71) Applicant: Advanced Semiconductor Engineering, Inc., Kaohsiung (TW)

(72) Inventors: Wei-Jhen Ciou, Kaohsiung (TW); Jenchun Chen, Kaohsiung (TW); Chang-Fu Lu, Kaohsiung (TW); Pai-Sheng Shih, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 153 days.

(21) Appl. No.: 17/680,069

(22) Filed: Feb. 24, 2022

(65) Prior Publication Data

US 2023/0269866 A1 Aug. 24, 2023

(51) Int. Cl.
*H05K 1/02* (2006.01)
*H05K 1/18* (2006.01)

(52) U.S. Cl.
CPC .......... *H05K 1/0271* (2013.01); *H05K 1/181* (2013.01); *H05K 2201/10098* (2013.01)

(58) Field of Classification Search
CPC .. H05K 1/18; H05K 1/181–184; H05K 3/284; H05K 9/0024; H01L 21/6835
USPC ................. 361/767, 784, 790–795, 816, 818; 174/520; 257/660–690, 787–790
See application file for complete search history.

(56) References Cited

U.S. PATENT DOCUMENTS

| | | | |
|---|---|---|---|
| 5,232,758 A * | 8/1993 | Juskey | H05K 3/284 29/841 |
| 5,394,304 A * | 2/1995 | Jones | H05K 5/0095 174/383 |
| 5,461,545 A * | 10/1995 | Leroy | H05K 3/284 174/394 |
| 5,594,204 A * | 1/1997 | Taylor | H05K 5/0269 174/541 |
| 6,262,513 B1 * | 7/2001 | Furukawa | H03H 9/6436 257/E23.128 |
| 7,161,092 B2 * | 1/2007 | Glovatsky | B32B 15/085 174/525 |
| 8,004,860 B2 * | 8/2011 | Salzman | H05K 9/0084 361/753 |
| 8,030,750 B2 | 10/2011 | Kim et al. | |
| 8,276,268 B2 * | 10/2012 | Kapusta | H05K 1/181 29/846 |
| 9,949,377 B2 * | 4/2018 | Sorenson | H05K 3/284 |
| 10,242,957 B2 * | 3/2019 | Kim | H01L 25/50 |
| 10,937,741 B2 * | 3/2021 | Yang | H01L 21/568 |
| 10,985,109 B2 * | 4/2021 | Kim | H01L 21/563 |
| 11,605,571 B2 * | 3/2023 | Teixeira De Queiros | H01L 21/6835 |
| 2005/0039935 A1 * | 2/2005 | Kolb | H05K 9/0024 174/350 |

(Continued)

*Primary Examiner* — Tuan T Dinh
(74) *Attorney, Agent, or Firm* — FOLEY & LARDNER LLP

(57) ABSTRACT

An electronic device is provided. The electronic device includes a carrier, a first electronic component, a second electronic component, and an encapsulant. The first electronic component is disposed at a first side of the carrier. The second electronic component is disposed at a second side of the carrier opposite to the first side. The encapsulant encapsulates the first electronic component and has an uneven thickness. The encapsulant is configured to reduce a warpage of the carrier.

10 Claims, 14 Drawing Sheets

(56) References Cited

U.S. PATENT DOCUMENTS

| | | | |
|---|---|---|---|
| 2006/0152913 A1* | 7/2006 | Richey | H05K 9/0024 |
| | | | 361/818 |
| 2010/0319981 A1* | 12/2010 | Kapusta | H05K 9/0024 |
| | | | 427/96.4 |
| 2018/0159216 A1* | 6/2018 | Kai | H01L 23/66 |
| 2018/0205155 A1 | 7/2018 | Mizunuma et al. | |
| 2019/0074267 A1* | 3/2019 | Yang | H01L 25/16 |
| 2020/0194379 A1* | 6/2020 | Kim | H01L 24/17 |
| 2020/0373244 A1* | 11/2020 | Kang | H01L 23/3672 |

\* cited by examiner

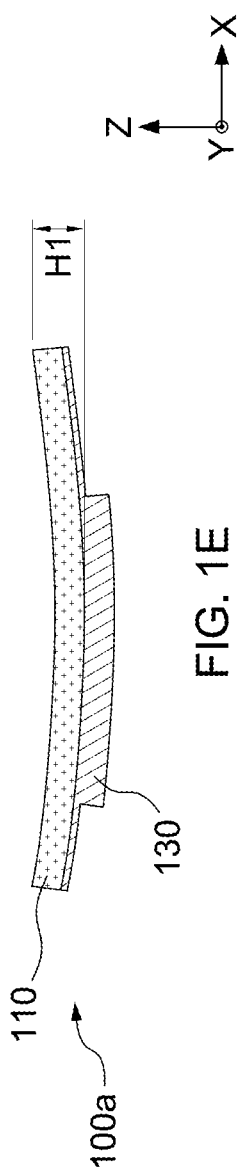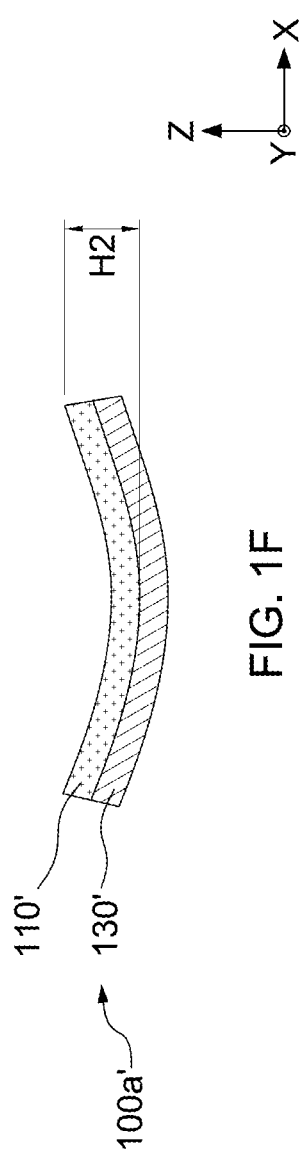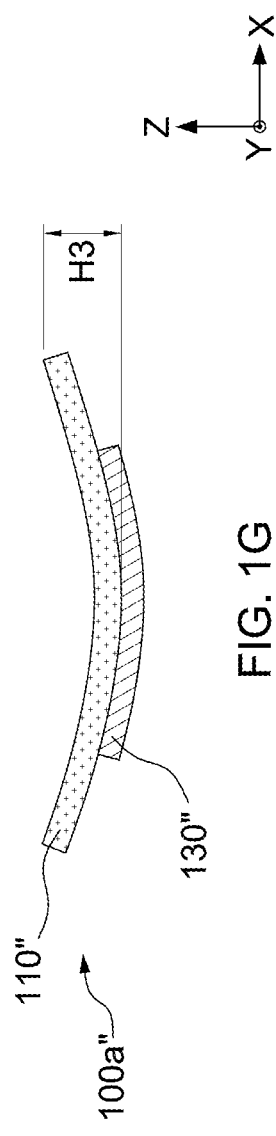

ELECTRONIC DEVICE

BACKGROUND

1. Field of the Disclosure

The present disclosure relates to an electronic device, and particularly to an electronic device having an encapsulant of uneven thickness.

2. Description of the Related Art

When various components are disposed on opposite sides of a carrier, warpage can affect the yield of electronic devices. Specifically, when components are not uniformly attached to a carrier, warpage can increase. In such a situation, when components are to be bonded to the opposite of the carrier, bonding may occur in an undesired region due to the deformation. Therefore, an electronic device ameliorating the shortcomings described is desirable.

SUMMARY

In some embodiments, an electronic device includes a carrier, a first electronic component, a second electronic component, and an encapsulant. The first electronic component is disposed at a first side of the carrier. The second electronic component is disposed at a second side of the carrier opposite to the first side. The encapsulant encapsulates the first electronic component and has an uneven thickness. The encapsulant is configured to reduce a warpage of the carrier.

In some embodiments, an electronic device includes a carrier and an encapsulant. The carrier has a first lateral surface. The encapsulant is disposed on the carrier and has a first portion, a second portion connected to the first portion and a first stepped portion defined by the first portion and the second portion. The first portion has a lateral surface substantially aligned with the first lateral surface of the carrier.

In some embodiments, an electronic device includes a carrier, an encapsulant, and an antenna. The carrier includes a mounting area and a non-mounting area. The encapsulant covers the mounting area and the non-mounting area and has an uneven thickness. The antenna component is disposed under the carrier. A width of the antenna component is greater than a width of the mounting area.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 1E illustrating warpage of the carrier of an electronic device according to some embodiments of the present disclosure.

FIG. 1F illustrating warpage of the carrier of a comparative electronic device.

FIG. 1G illustrating warpage of the carrier of a comparative electronic device.

DETAILED DESCRIPTION

Figure 1A:
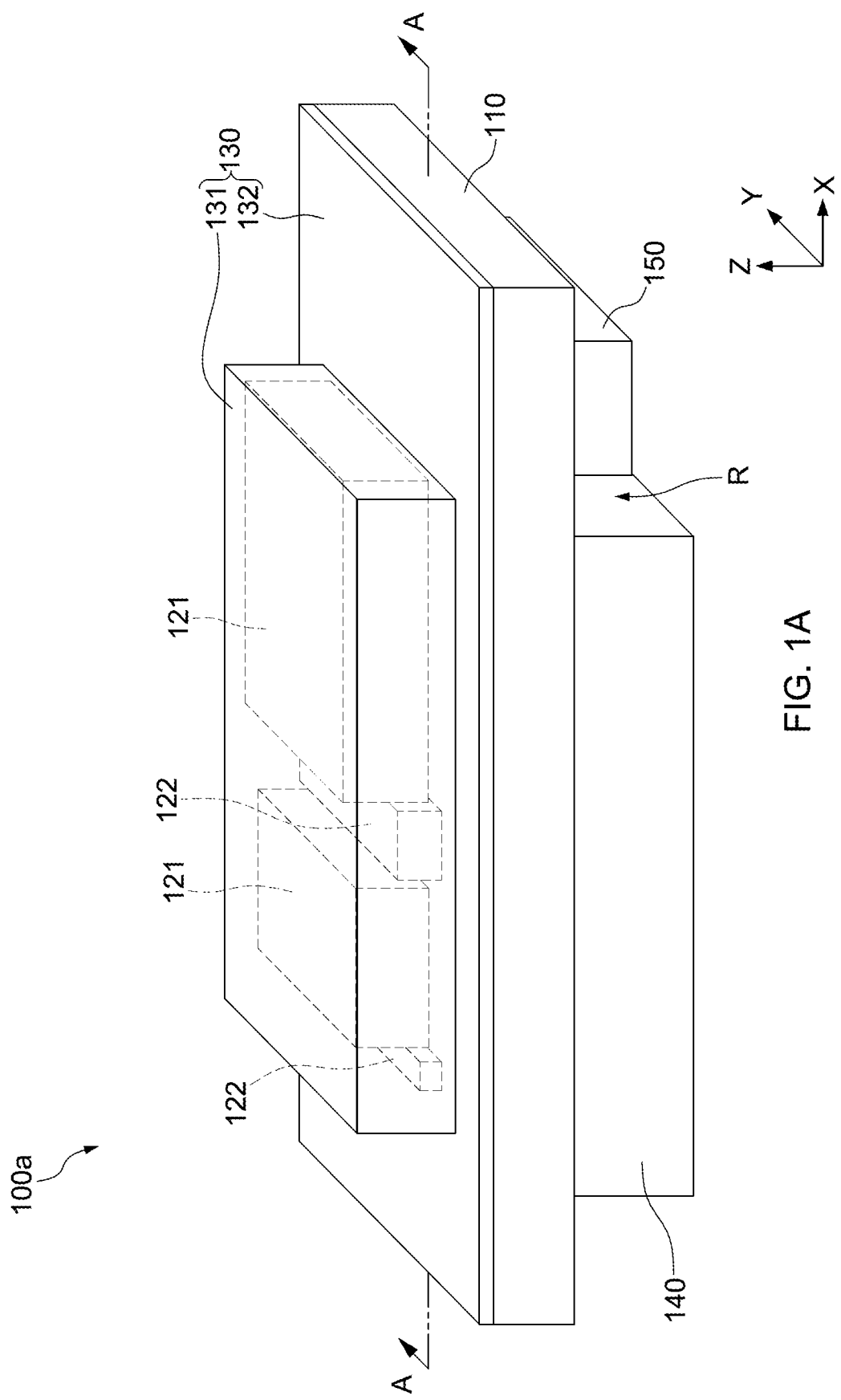
FIG. 1A is a perspective view of an exemplary electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
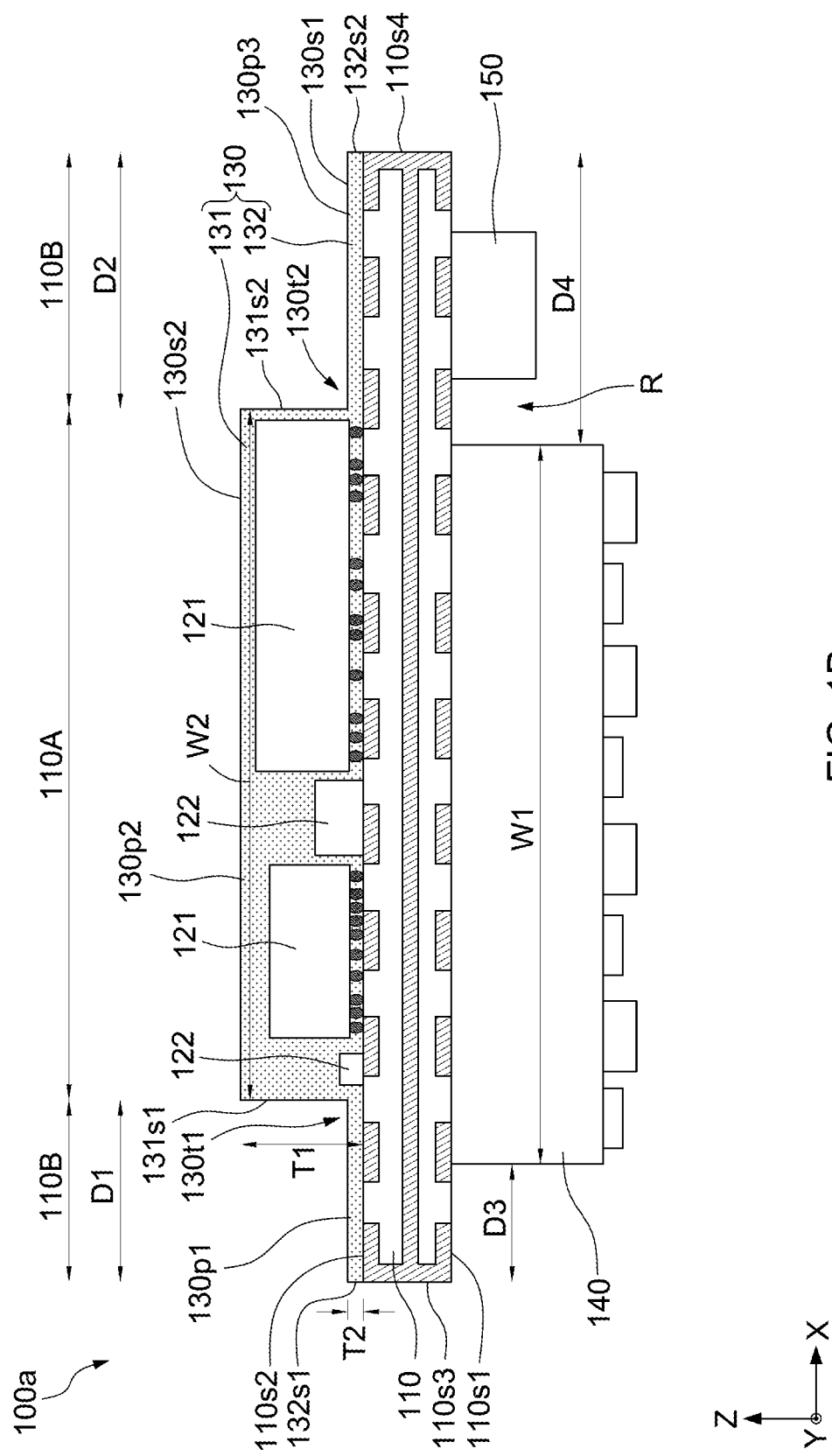
FIG. 1B is a cross-sectional view along line A-A of the electronic device shown in FIG. 1A according to some embodiments of the present disclosure.

Referring to FIG. 1A and FIG. 1B, FIG. 1A is a perspective view of an example of an electronic device 100a according to some embodiments of the present disclosure, and FIG. 1B is a cross-sectional view along line A-A of the electronic device 100a shown in FIG. 1A.

In some embodiments, the electronic device 100a may include a carrier 110, a plurality of electronic components 121, electronic components 122, an encapsulant 130, an antenna component 140, and a connector 150.

The carrier 110 may include a semiconductor substrate, which includes silicon or germanium in single crystal, polycrystalline, or amorphous form. The carrier 110 may include a redistribution layer (RDL) or traces for electrical connection between components. The carrier 110 can be replaced by other suitable carriers, such as a glass carrier, a lead frame, a printed circuit board, or other suitable carriers. The carrier 110 may have a surface (or a side) 110s1, a surface (or a side) 110s2 opposite to the surface 110s1, a surface (or a side) 110s3 extending between the surface 110s1 and the surface 110s2, and a surface (or a side) 110s4 opposite to the surface 110s3. The surface 110s1 may also be referred to as an upper surface. The surface 110s2 may also be referred to as a lower surface. The surfaces 110s3 and 110s4 may also be referred to as a lateral surface.

In some embodiments, the surface 110s2 of the carrier 110 may include a mounting area 110A and a non-mounting area 110B. The mounting area 110A may be configured to provide a region on which the electronic components 121 and/or electronic components 122 are mounted. In some embodiments, the non-mounting area 110B may surround the mounting area 110A. In some embodiments, no active components, such as electronic components, optoelectronic components, optical components, or the like, are mounted on the non-mounting area 110B of the carrier 110. In some embodiments, no passive components, such as capacitors, resistors, inductors, or the like, are mounted on the non-mounting area 110B of the carrier 110. In some embodiments, the geometric center of the mounting area 110A may not overlap the geometric center of the carrier 110 along a Z-axis. In some embodiments, the geometric center of the mounting area 110A may misalign with the geometric center of the carrier 110. In some embodiments, the distance between the mounting area 110A and the surface 110s3 may be different from that between the mounting area 110A and the surface 110s4. In some embodiments, the non-mounting area 110B has a side edge distal from the mounting area 110A.

In some embodiments, the electronic component 121 may be disposed on the surface 110s2 of the carrier 110. The electronic component 121 may be mounted within the mounting area 110A of the carrier 110. The electronic component 121 may be signally connected to the carrier 110. The electronic component 121 may be electrically connected to the carrier 110 by, for example, solder. In other embodiments, the electronic component 121 may be electrically connected to the carrier 110 through wire bond or other suitable conductive elements. The electronic component 121 may be optically connected to the carrier 110. In some embodiments, the active surface of the electronic component 121 may face the carrier 110. In some embodiments, the active surface of the electronic component 121 may face away the carrier 110. The electronic component 121 may include active components. The active components may be used to inject power into a circuit, control or amplify signals, which may include time-varying voltage, current, electromagnetic wave, photon, or other signals. The electronic component 121 may include input/outputs (I/O) terminals, which may be used to receive and send signals, respectively. In some embodiments, the electronic component 121 may include a semiconductor die or a chip, such as a logic die (e.g., system-on-a-chip (SoC), central processing unit (CPU), graphics processing unit (GPU), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components.

In some embodiments, the electronic component 122 may be disposed on the surface 110s2 of the carrier 110. The electronic components 121 and 122 may be alternatively arranged along X-axis. The electronic component 122 may be mounted within the mounting area 110A of the carrier 110. The electronic component 122 may be signally connected to the carrier 110. The electronic component 122 may be electrically connected to the carrier 110. The electronic component 122 may be configured to use or store energy. The electronic component 122 may be configured to adjust a signal of an output of the electronic component 121. The electronic component 122 may be configured to adjust a power signal of the electronic component. The electronic component 122 may be configured to stabilize a voltage of the output of the electronic component 121. The electronic component 122 may be configured to adjust a data signal of the electronic component 121. The electronic component 122 may be configured to filter the data signal. For example, the electronic component 122 may serve as a filter, a coupler, oscillator, etc. In some embodiments, the electronic component 122 may include a capacitor, a resistor, an inductor or other passive component.

In some embodiments, the encapsulant 130 may be disposed on the surface 110s2 of the carrier 110. In some embodiments, the encapsulant 130 may encapsulate the electronic component 121 and the electronic component 122. In some embodiments, the encapsulant 130 may cover the mounting area 110A of the carrier 110. In some embodiments, the encapsulant 130 may cover the non-mounting area 110B of the carrier 110. In some embodiments, the encapsulant 130 may be configured to modify warpage of the carrier 110. In some embodiments, the encapsulant 130 may be configured to reduce warpage of the carrier 110. In some embodiments, the encapsulant 130 may be made of molding material that may include, for example, a Novolac-based resin, an epoxy-based resin, a silicone-based resin, or other suitable encapsulant. Suitable fillers may also be included, such as powdered $SiO_2$.

In some embodiments, the encapsulant 130 may be of uneven thickness. The encapsulant 130 may have a portion 131 and a portion 132. The portion 132 may surround the portion 131. In some embodiments, the portion 132 of the encapsulant 130 has a ring shape profile surrounding the portion 131. The portion 131 of the encapsulant 130 may be integral with the portion 132 of the encapsulant 130. For example, no interface may be formed between the portion 131 and the portion 132. No interface may be observed between the portion 131 and the portion 132. The roughness of the portion 132 may be substantially the same as that of the portion 131. The roughness of the upper surface of the portion 132 may be substantially the same as that of the portion 131. The roughness of the lateral surface of the portion 132 may be substantially the same as that of the portion 131. The roughness of the upper surface of the portion 132 may be substantially the same as that the lateral surface of the portion 132. In some embodiments, the roughness of the surface 130s1 of the encapsulant 130 is substantially equal to the roughness of the surface 130s2 of the encapsulant 130.

The portion 131 may be of a thickness T1. The portion 132 may be of a thickness T2. The thickness T1 may exceed the thickness of the electronic component 121 or electronic component 122. In some embodiments, the thickness T2 may exceed the particle size of the filler of the encapsulant 130. In some embodiments, the thickness T2 may exceed the height of the filler of the encapsulant 130. In some embodiments, the thickness T1 may differ from the thickness T2. In some embodiments, the thickness T1 may exceed the thickness T2. As shown in FIG. 1A, the encapsulant 130 may have a stepped structure defined by the portion 131 and the portion 132. In some embodiments, the thickness T1 may range from about 4001 μm to about 1000 μm, such as 400 μm, 500 μm, 550 μm, 580 μm, 600 μm, 620 μm, 650 μm, 700 μm, 800 μm, 900 μm, or 1000 μm. In some embodiments, the thickness T2 may range from about 20 µm to about 600 µm, such as 20 µm, 50 µm, 100 µm, 200 µm, 300 µm, 400 µm, 500 µm or 600 µm. In some embodiments, the thickness T2 may be substantially equal to a distance between the bottom surface of the electronic component 121 and the carrier 110. In some embodiments, the portion 131 of the encapsulant 130 may substantially fully cover the mounting area 110A of surface 110s2 of the carrier 110. In some embodiments, no portion of the surface 110s2 of the carrier 110 remains uncovered by the encapsulant 130 along the Z-axis.

In some embodiment, the portion 131 of the encapsulant 130 may be disposed on the mounting area 110A of the carrier 110. The portion 131 of the encapsulant 130 may encapsulate the electronic component 121. The portion 131 of the encapsulant 130 may encapsulate the electronic component 122. In some embodiments, the encapsulant 130 may substantially fully cover the surface 110s2 of the carrier 110.

The portion 132 of the encapsulant 130 may be disposed on the non-mounting area 110B of the carrier 110. In some embodiments, the portion 132 of the encapsulant 130 may substantially fully cover the non-mounting area 110B of the surface 110s2 of the carrier 110. In some embodiments, no active components are covered by the portion 132 of the encapsulant 130. In some embodiments, no passive components are covered by the portion 132 of the encapsulant 130.

In some embodiments, the encapsulant 130 may have an irregular shape or profile. In some embodiments, the irregular shape or profile of the encapsulant 130 may be defined by the portions 131 and 132 of the encapsulant 130. In some embodiments, the geometric center of the portion 131 of the encapsulant 130 may not overlap the geometric center of the carrier 110 along a Z-axis. In some embodiments, the geometric center of the portion 131 of the encapsulant 130 may misalign with the geometric center of the carrier 110. In some embodiments, the distance D1 between the portion 131 of the encapsulant 130 and the surface 110s3 of the carrier 110 may be different from the distance D2 between the portion 131 of the encapsulant 130 and the surface 110s4 of the carrier 110. For example, the distance D1 may be less than the distance D2. In some embodiments, the portion 131 of the encapsulant 130 may have a surface 131s1 distal from the surface 110s3 of the carrier 110. In some embodiments, the portion 131 may have a surface 131s2 distal from the surface 110s4 of the carrier 110. In some embodiments, the portion 132 may have a surface 132s1 substantially coplanar with the surface 110s3 of the carrier 110. In some embodiments, the portion 132 may have a surface 132s2 substantially coplanar with the surface 110s4 of the carrier 110. In some embodiments, the portion 132 of the encapsulant 130 may extend between the lateral surface (e.g., surface 131s1 or 132s2) of the portion 131 of the encapsulant 130 and the lateral surface (e.g., surface 110s3 or 110s4) of the carrier 110. In some embodiments, the encapsulant 130 has a first stepped portion 130t1 defined by the surface 131s1 of the encapsulant 130 and a surface 130s1 of the encapsulant 130. In some embodiments, the encapsulant 130 has a second step portion 130t2 defined by the surface 131s2 of the encapsulant 130 and the surface 130s1 of the encapsulant 130. The first step portion 130t1 is closer to the surface 110s3 of the carrier 110. The second step portion 130t2 is closer to the surface 110s4 of the carrier 110.

In some embodiments, the antenna component (or electronic component) 140 may be disposed or mounted on the surface 110s1 of the carrier 110. In some embodiments, the antenna component 140 may be attached on the surface 110s1 of the carrier 110 by an adhesive (not shown). The antenna component 140 may be applied to a semiconductor device that may be operated at a high frequency. In some embodiments, the antenna component 140 may be applied to a semiconductor device that may be operated at a frequency in the range of about 2 GHz to about 300 GHz, about 5 GHz to about 300 GHz, about 10 GHz to about 300 GHz, about 15 GHz to about 300 GHz, about 20 GHz to about 300 GHz, about 25 GHz to about 300 GHz, about 30 GHz to about 300 GHz, about 35 GHz to about 300 GHz, about 40 GHz to about 300 GHz, or about 45 GHz to about 300 GHz. The antenna component 140 may include, for example but is not limited to, a directional antenna, an omnidirectional antenna, an antenna array, a dipole antenna and/or a patch antenna. The antenna component 140 may function as a broadside coupling antenna or an End-Fire radiation antenna. The antenna component 140 may be signally coupled to the electronic component 121. The antenna component 140 may be electrically and/or optically coupled to the electronic component 121. The antenna component 140 may be electrically and/or optically coupled to the electronic component 121 through the carrier 110. The antenna component 140 may be signally coupled to the electronic component 122. The antenna component 140 may be electrically and/or optically coupled to the electronic component 122. The antenna component 140 may be electrically and/or optically coupled to the electronic component 122 through the carrier 110.

In some embodiments, the portion 131 of the encapsulant 130 may overlap the antenna component 140 along a Z-axis. In some embodiments, the portion 131 of the encapsulant 130 may partially overlap the antenna component 140 along a Z-axis. In some embodiments, the antenna component 140 partially overlaps the mounting area 100A from a bottom perspective view. In some embodiments, the portion 132 of the encapsulant 130 may overlap the antenna component 140 along a Z-axis. In some embodiments, the portion 132 of the encapsulant 130 may partially overlap the antenna component 140 along a Z-axis. In some embodiments, the antenna component 140 partially overlaps the non-mounting area 100B from a bottom perspective view. In some embodiments, the geometric center of the antenna component 140 may not overlap the geometric center of the portion 131 of the encapsulant 130 along a Z-axis. In some embodiments, the distance D3 between the antenna component 140 and the surface 110s3 of the carrier 110 may be different from the distance D4 between the antenna component 140 and the surface 110s4 of the carrier 110. For example, the distance D3 may be less than the distance D4. In some embodiments, the antenna component 140 may have a side edge distal from the surface 110s3 of the carrier 110. In some embodiments, the antenna component 140 may have a side edge distal from the surface 110s4 of the carrier 110. In some embodiments, the distance D1 may exceed the distance D3. In some embodiments, the distance D4 may exceed the distance D2.

In some embodiments, the connector 150 may be disposed on the surface 110s1 of the carrier 110. The connector 150 may be closer to the surface 110s4 of the carrier 110 than to the surface 110s3 of the carrier 110. In some embodiments, the connector 150 may be free from overlapping the portion 131 of the encapsulant 130 along a Z-axis. In some embodiments, the connector 150 may overlaps the portion 132 of the encapsulant 130 along a Z-axis. In some embodiments, the connector 150 may be configured to signally couple to an external component (not shown). In some embodiments, the connector 150 may be configured to signally couple to the electronic component 121. The connector 150 may be electrically and/or optically coupled to the electronic component 121. The connector 150 may be electrically and/or optically coupled to the electronic component 121 through the carrier 110. In some embodiments, the connector 150 may be configured to signally couple to the electronic component 122. The connector 150 may be electrically and/or optically coupled to the electronic component 122. The connector 150 may be electrically and/or optically coupled to the electronic component 122 through the carrier 110. In some embodiments, the connector 150 may be configured to signally couple to the antenna component 140. The connector 150 may be electrically and/or optically coupled to the antenna component 140. The connector 150 may be electrically and/or optically coupled to the antenna component 140 through the carrier 110.

In some embodiments, a space R may be located between the antenna component 140 and the connector 150 along an X-axis. In some embodiments, the portion 131 of the encapsulant 130 may overlap the space R along a Z-axis. In some embodiments, the portion 131 of the encapsulant 130 may partially overlap the space R along a Z-axis. In some embodiments, the portion 132 of the encapsulant 130 may overlap the space R along a Z-axis. In some embodiments, the portion 132 of the encapsulant 130 may partially overlap the space R along a Z-axis. In some embodiments, the encapsulant 130 has a first portion 130$p1$ between the surface 131$s1$ and surface 132$s1$ of the encapsulant 130. In some embodiments, the encapsulant 130 has a second portion 130$p2$ over or above the mounting area 110A of the carrier 110. In some embodiments, the encapsulant 130 has a third portion 130$p3$ between the surfaces 131$s2$ and 132$s2$ of the encapsulant 130. The second portion 130$p2$ of the encapsulant 130 may be disposed between the first portion 130$p1$ and the third portion 130$p3$ of the encapsulant 130. In some embodiments, a width W1 of the antenna component 140 may be greater than a width W2 of the mounting area 110A of the carrier 110 along an X-axis. In some embodiments, the first stepped portion 130$t1$ may be defined by the first portion 130$p1$ and second portion 130$p2$ of the encapsulant 130. In some embodiments, the second stepped portion 130$t2$ may be defined by the third portion 130$p3$ and second portion 130$p2$ of the encapsulant 130. In some embodiments, the distance D2 between the surface 110$s4$ of the carrier 110 and second stepped portion 130$t2$ may be greater than the distance D1 between the surface 110$s3$ of the carrier 110 and the first stepped portion 130$t1$.

In some embodiments, the antenna component 140 is attached to or mounted on the surface 110$s1$ of the carrier 110 after the encapsulant 130 is formed on the carrier 110. The electronic component 121, electronic component 122, encapsulant 130 may impose stress on the carrier 110, causing warpage thereof. In a comparative example, the encapsulant 130 may be of a substantially uniform thickness, or a substantially uniform height (or elevation) over the carrier 110, which may increase stress on the carrier 110, causing increased warpage. In such a situation, the deformation may cause the antenna component 140 to be mounted on an undesired area, degrading the performance of the electronic device. In another comparative example, a portion of the upper surface of the carrier is not covered by the encapsulant, which may also increase stress on the carrier 110, especially on the mounting area. In such a situation, the deformation may cause the antenna component 140 to be mounted on an undesired area, degrading the performance of the electronic device. In another comparative example, dummy components may be disposed on the carrier to modify warpage imposed on the carrier. However, using the dummy components may increase costs and cycle time of fabrication. In this embodiment of the present disclosure, the encapsulant 130 may be of different thicknesses in different areas, reducing warpage imposed on the carrier 110. Therefore, the antenna component 140 may be attached to or mounted in a desired area, improving the performance of the electronic device 100$a$. Further, fewer or no dummy components are utilized. Thus, cost and cycle time of fabrication of the electronic device 100$a$ may be comparatively reduced.

Figure 1D:
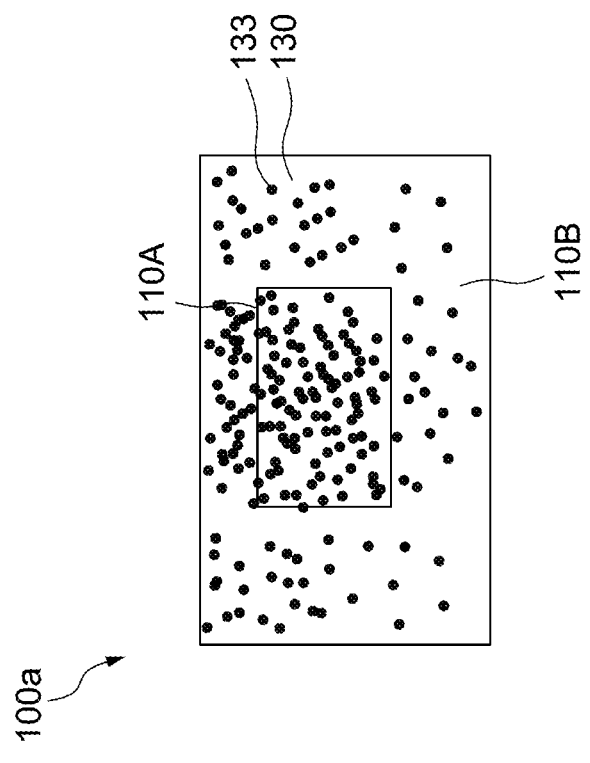
FIG. 1D is a simulation result of the density of fillers in an encapsulant of the semiconductor package from a top view in accordance with some embodiments of the present disclosure.
Figure 1D:
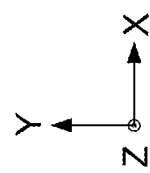
Figure 1C:
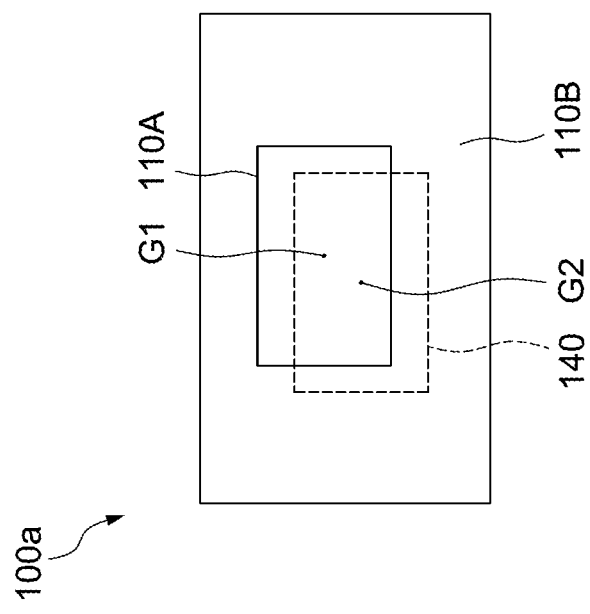
FIG. 1C is a top view of the electronic device shown in FIG. 1A according to some embodiments of the present disclosure.
Figure 1C:
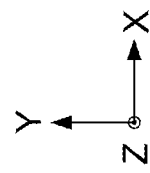

FIG. 1C is a top view of the electronic device 100$a$ shown in FIG. 1A according to some embodiments of the present disclosure. As shown in FIG. 1C, the geometry center G1 of the mounting area 110A may be misaligned to the geometry center G2 of the antenna component 140 from a top view. In some embodiments, the geometry center G1 of the mounting area 110A may be misaligned to the geometry center G2 of the antenna component 140 along a Z-axis. As used herein, the term "geometry center" in this disclosure may refer to a center of gravity of a profile of a component from a top view. For example, the geometry center G2 of the antenna component 140 may refer to the center of gravity of the profile of the antenna component 140 in a top view.

FIG. 1D is a simulation result of the density of fillers 130 in an encapsulant 130 of the semiconductor package from a top view in accordance with some embodiments of the present disclosure. As shown in FIG. 1D, the density of fillers 133 of the encapsulant 130 in the mounting area 110A may be greater than the density of fillers 133 of the encapsulant 130 in the non-mounting area 110B.

FIG. 1E illustrates warpage of the carrier 110 of an electronic device 100$a$ according to some embodiments of the present disclosure. FIG. 1F and FIG. 1G illustrate warpage of the carrier of comparative electronic devices 100$a'$ and 100$a''$. As shown in FIG. 1F, the encapsulant 130' of the electronic package 100$a'$ has an even thickness and cover both the mounting area and non-mounting area of the carrier 110'. As shown in FIG. 1G, the encapsulant 130" of the electronic package 100$a''$ only covers the mounting area of the carrier 110", and the non-mounting area is exposed from the encapsulant 130". As shown in FIGS. 1E, 1F, and 1G, the warpage of the carrier 110, 110', and 110" may be different from each other. The warpage may be estimated by the height difference of a carrier in a cross-sectional view. That is, the degree of warpage of a carrier may be proportional to the height difference of a carrier. The height difference may refer to a height difference between the mounting area and the non-mounting area or a height difference between the topmost and bottommost points. As shown in FIGS. 1E, 1F, and 1G, the height difference of the carrier 110, 110', and 110" are H1, H2, and H3, respectively. In some embodiments, H1 may be less than H2. In some embodiments, H1 may be less than H3. In some embodiments, the encapsulant 130 of the electronic device 100$a$ can be configured to reduce the height difference of the carrier 110. In some embodiments, the encapsulant 130 can be configured to reduce the height difference of the mounting area 110A and non-mounting area 110B of carrier 110. In some embodiments, the portion 132 of the encapsulant 130 may be configured to reduce the height difference of the mounting area 110A and non-mounting area 110B of carrier 110.

Figure 2:
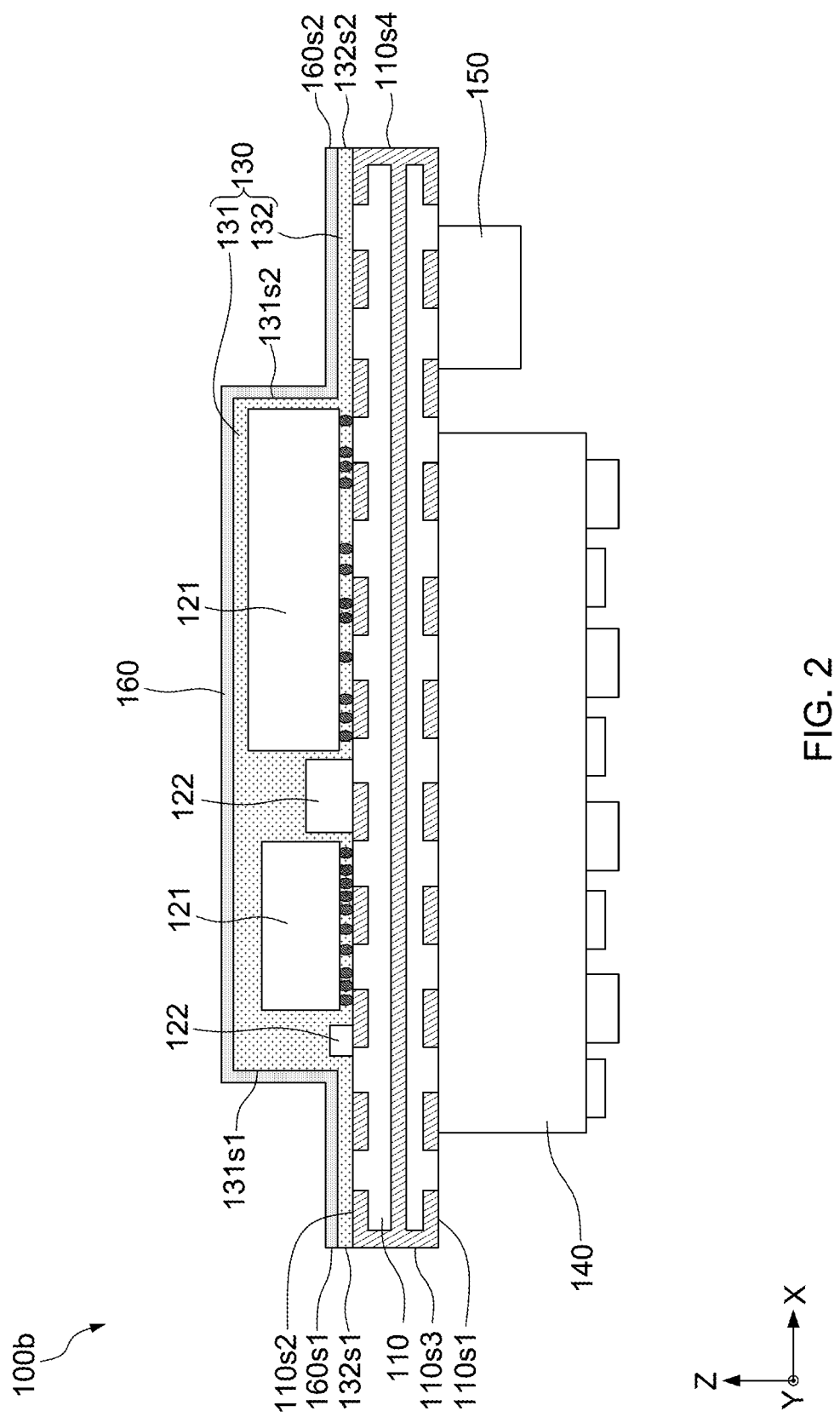
FIG. 2 is a cross-sectional view of an exemplary electronic device according to some embodiments of the present disclosure.

FIG. 2 is a cross-section of an exemplary electronic device 100$b$ according to some embodiments of the present disclosure. The electronic device 100$b$ of FIG. 2 may have a structure similar to that of the electronic device 100$a$ of FIG. 1 except that the electronic device 100b may further include an electromagnetic interference shielding (EMI) layer 160.

In some embodiments, the EMI shielding layer 160 may be configured to protect the encapsulant 130 from oxidation, and the EMI shielding effect is further enhanced by the EMI shielding layer 160. In some embodiments, the EMI shielding layer 160 may be disposed on the surface 110s2 of the carrier 110. In some embodiments, the EMI shielding layer 160 may be disposed on the encapsulant 130. In some embodiments, the EMI shielding layer 160 may be conformally disposed on the portion 131 and the portion 132 of the encapsulant 130. In some embodiments, the EMI shielding layer 160 may fully cover the upper surface of the encapsulant 130. The EMI shielding layer 160 may have a surface 160s1 and a surface 160s2 opposite to the surface 160s1. In some embodiments, the surface 160s1 of the EMI shielding layer 160 is substantially coplanar with the surface 132s1 of the portion 132. In some embodiments, the surface 110s3 of the carrier 110 may be substantially coplanar with surface 160s1 of the EMI shielding layer 160. In some embodiments, the surface 160s2 of the EMI shielding layer 160 is substantially coplanar with the surface 132s2 of the portion 132. In some embodiments, the surface 110s4 of the carrier 110 may be substantially coplanar with surface 160s2 of the EMI shielding layer 160. In some embodiments, the surface 132s1 and the surface 132s2 of the portion 132 of the encapsulant may not overlap the EMI shielding layer 160 along an X-axis. In some embodiments, the surface 110s3 and the surface 110s4 of the carrier 110 may not overlap the EMI shielding layer 160 along an X-axis.

Figure 3:
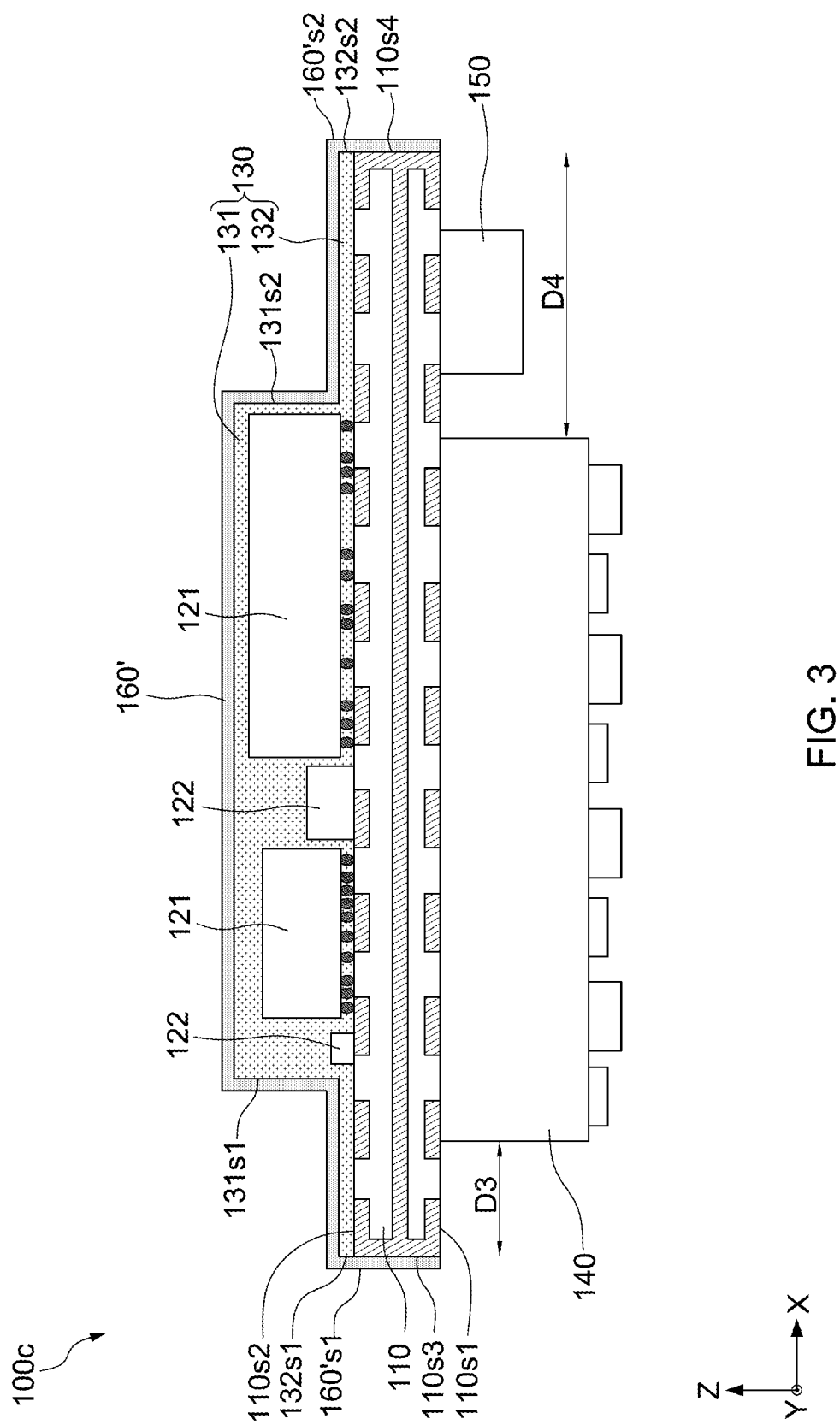
FIG. 3 is a cross-sectional view of an exemplary electronic device according to some embodiments of the present disclosure.

FIG. 3 is a cross-section of an exemplary electronic device 100c according to some embodiments of the present disclosure. The electronic device 100c of FIG. 3 may have a structure similar to that of the electronic device 100a of FIG. 1, further including an EMI shielding layer 160' replacing the EMI shielding layer 160.

In some embodiments, the EMI shielding layer 160' may be disposed on the surface 110s2 of the carrier 110. In some embodiments, the EMI shielding layer 160' may be disposed on the encapsulant 130. In some embodiments, the EMI shielding layer 160' may cover the surface 132s1 of the portion 132. In some embodiments, the EMI shielding layer 160' may cover the surface 132s2 of the portion 132. In some embodiments, the EMI shielding layer 160' may cover the surface 110s3 of the carrier 110. In some embodiments, the EMI shielding layer 160' may cover the surface 110s4 of the carrier 110. In some embodiments, the surface 160's1 of the EMI shielding layer 160' may not be coplanar with the surface 132s1 of the portion 132 of the encapsulant 130. In some embodiments, the surface 160's2 of the EMI shielding layer 160' may not be coplanar with the surface 132s2 of the portion 132 of the encapsulant 130. In some embodiments, the surface 160's1 of the EMI shielding layer 160' may not be coplanar with the surface 110s3 of the carrier 110. In some embodiments, the surface 160's2 of the EMI shielding layer 160' may not be coplanar with the surface 110s4 of the carrier 110. In some embodiments, the EMI shielding layer 160' may be conformally disposed on the upper surfaces and lateral surfaces of the portions 131 and 132 as well as on the lateral surface of the carrier 110.

Figure 4:
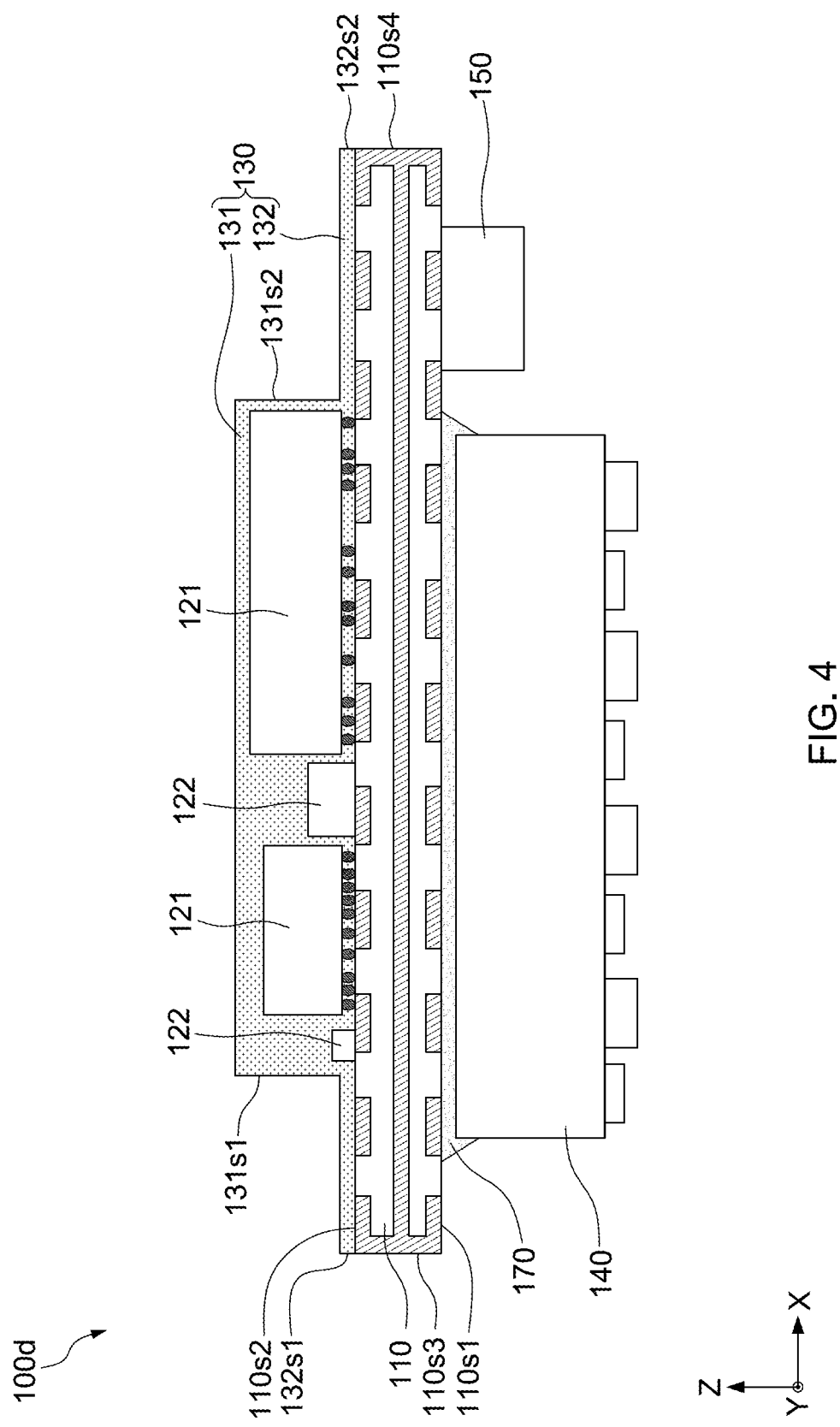
FIG. 4 is a cross-sectional view of an exemplary electronic device according to some embodiments of the present disclosure.

FIG. 4 is a cross-section of an exemplary electronic device 100d according to some embodiments of the present disclosure. The electronic device 100d of FIG. 4 may have a structure similar to that of the electronic device 100a of FIG. 1, further including a fixing component 170.

The fixing component 170 may be configured to fix the antenna component 140 to be attached on the surface 110s1 of the carrier 110. The fixing component 170 may be disposed between antenna component 140 and the surface 110s1 of the carrier 110. The fixing component 170 may partially cover the lateral surface of the antenna component 140. The fixing component 170 may include underfill. The fixing component 170 may include molded underfill (MUF). The fixing component 170 may include, for example, resin or other suitable materials.

FIG. 5, FIG. 5A, FIG. 6, FIG. 6A, FIG. 7, FIG. 8, and FIG. 9 illustrate various stages of an exemplary method for manufacturing an electronic device 100b according to some embodiments of the present disclosure.

Figure 5:
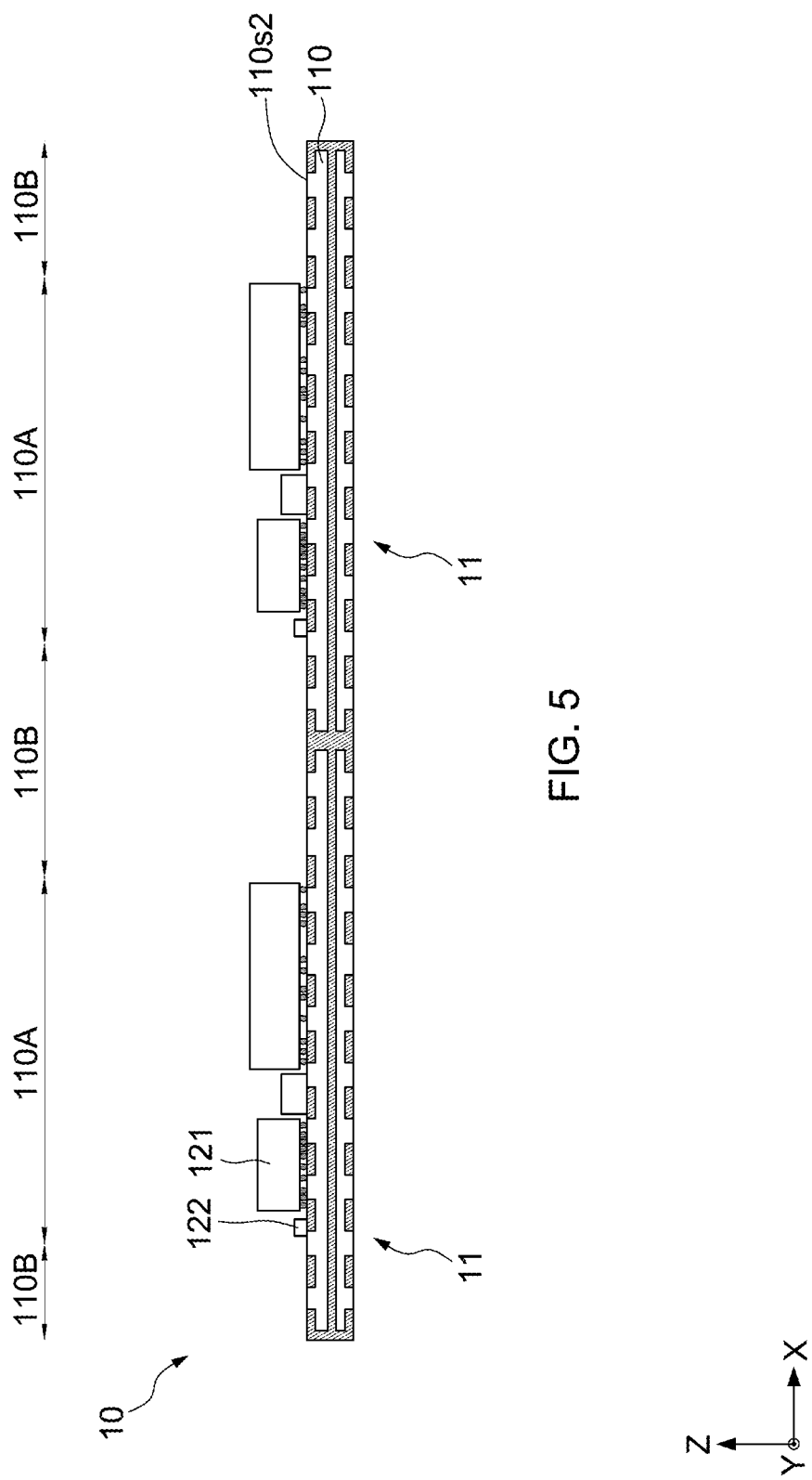
FIG. 5, FIG. 5A, FIG. 6, FIG. 6A, FIG. 7, FIG. 8, and FIG. 9 illustrate various stages of an exemplary method for manufacturing an electronic device according to some embodiments of the present disclosure.
Figure 5A:
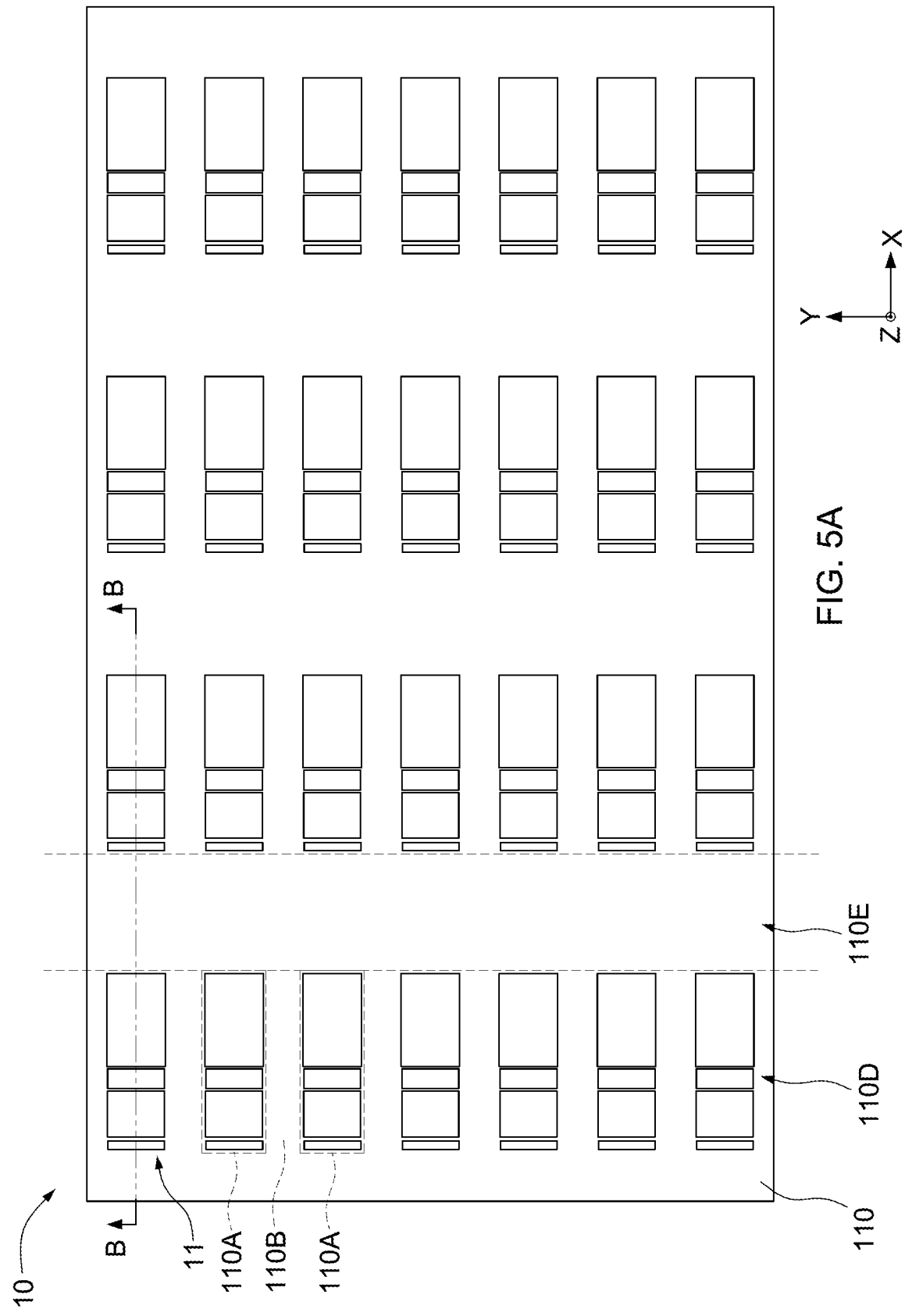

Referring to FIGS. 5 and 5A, FIG. 5A is a top view of an intermediate structure of the electronic device 100b, and FIG. 5 is a cross-section along line B-B of FIG. 5. An electronic component structure 10 may be provided. The electronic component structure 10 may include a plurality of units 11. Units 11 may be arranged as two dimensional arrays. Each unit 11 may correspond to an electronic device after the electronic component structure 10 is singulated. The electronic component 121 and the electronic component 122 may be mounted on the surface 110s2 of the carrier 110. The electronic component 121 and the electronic component 122 may be mounted on the mounting area 110A of the surface 110s2 of the carrier 110. No active and/or passive components are over the non-mounting area 110B of the surface 110s2 of the carrier 110. Further, the carrier 110 may have regions 110D and 110E. The region 110D may be a column on which the electronic components 121 and the electronic components 122 are disposed. The region 110E may be a column on which no components are disposed.

Figure 6:
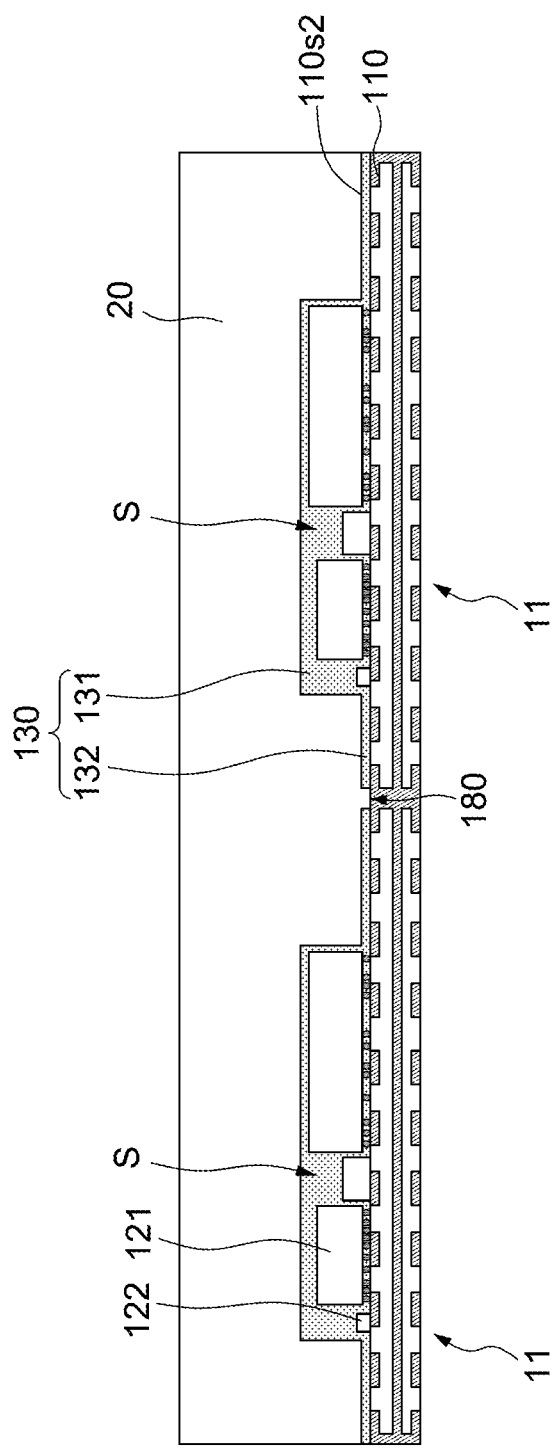
Figure 6A:
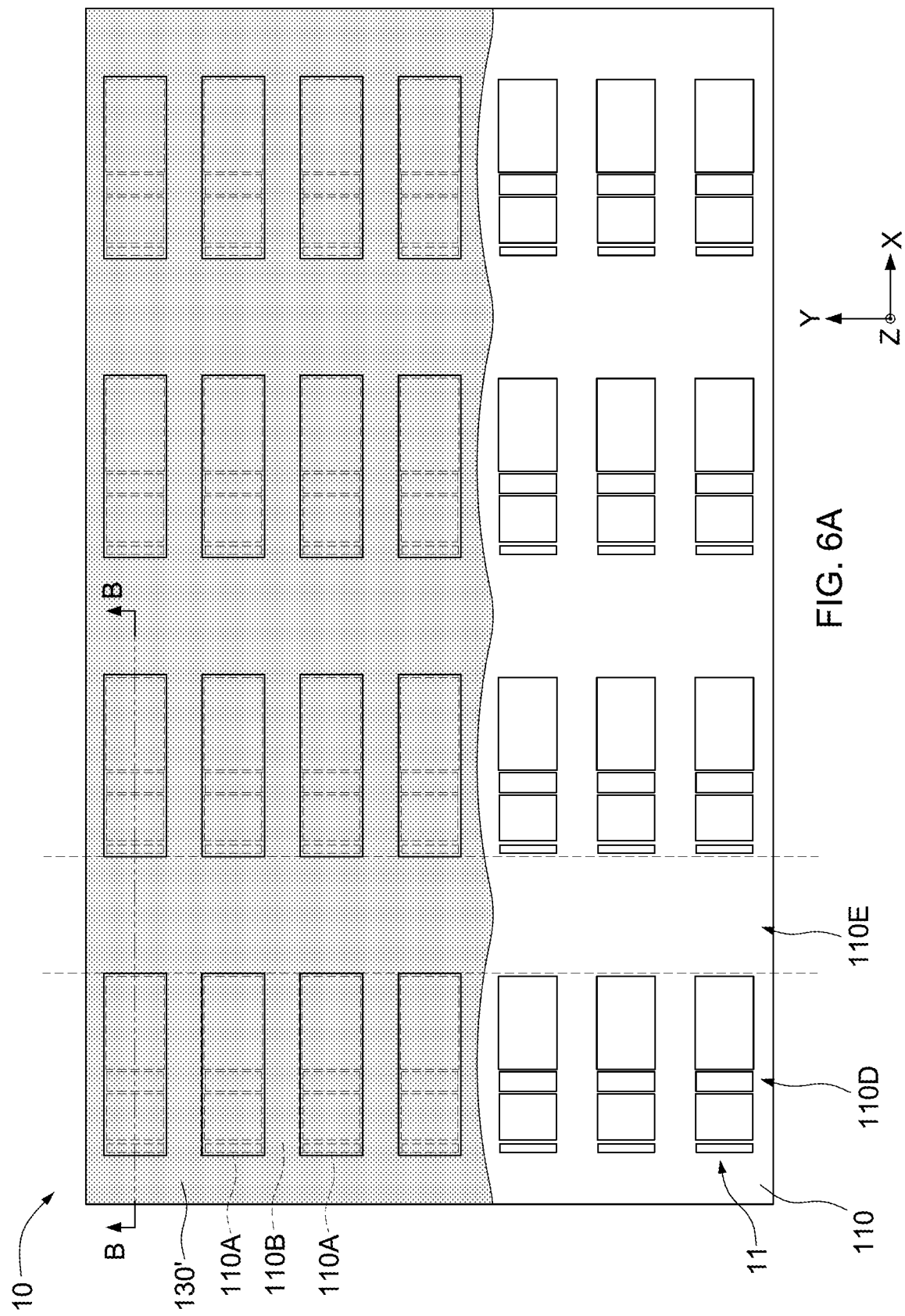

Referring to FIGS. 6 and 6A, a mold 20 is utilized to define the shape or profile of the encapsulant 130. The mold 20 may include a plurality of spaces S to accommodate each unit 11. The spaces S are spaced apart from each other by the mold 20. The mold 20 may be partially in contact with the surface 110s2 of the carrier 110. In some embodiments, the mold 20 may assist in forming the encapsulant 130 with a portion 131 and a portion 132 of different thicknesses. The portion of the surface 110s2 of the carrier 110 in contact with the mold 20 may be utilized to define a scribe line 180 which a saw cuts in subsequent process. After the mold 20 is fixed on the surface 110s2 of the carrier 110, molding material encapsulant 130' may be injected into the spaces R defined by the mold 20, thereby forming the encapsulant 130.

As shown in FIG. 6A, during injection of the molding material encapsulant 130', the flow speed of the molding material encapsulant 130' may have a relatively small difference in regions 110D and 110E due to the special shape of the mold 20. In a comparative example, a conventional mold is utilized, the molding material may have increased difference in flow in regions 110D and 110E of the carrier, causing voids in the encapsulant. More specifically, the flow speed of the molding material encapsulant 130' may have a relatively small difference along a Y-axis in regions 110D and 110E in comparison with comparative examples.

Figure 7:
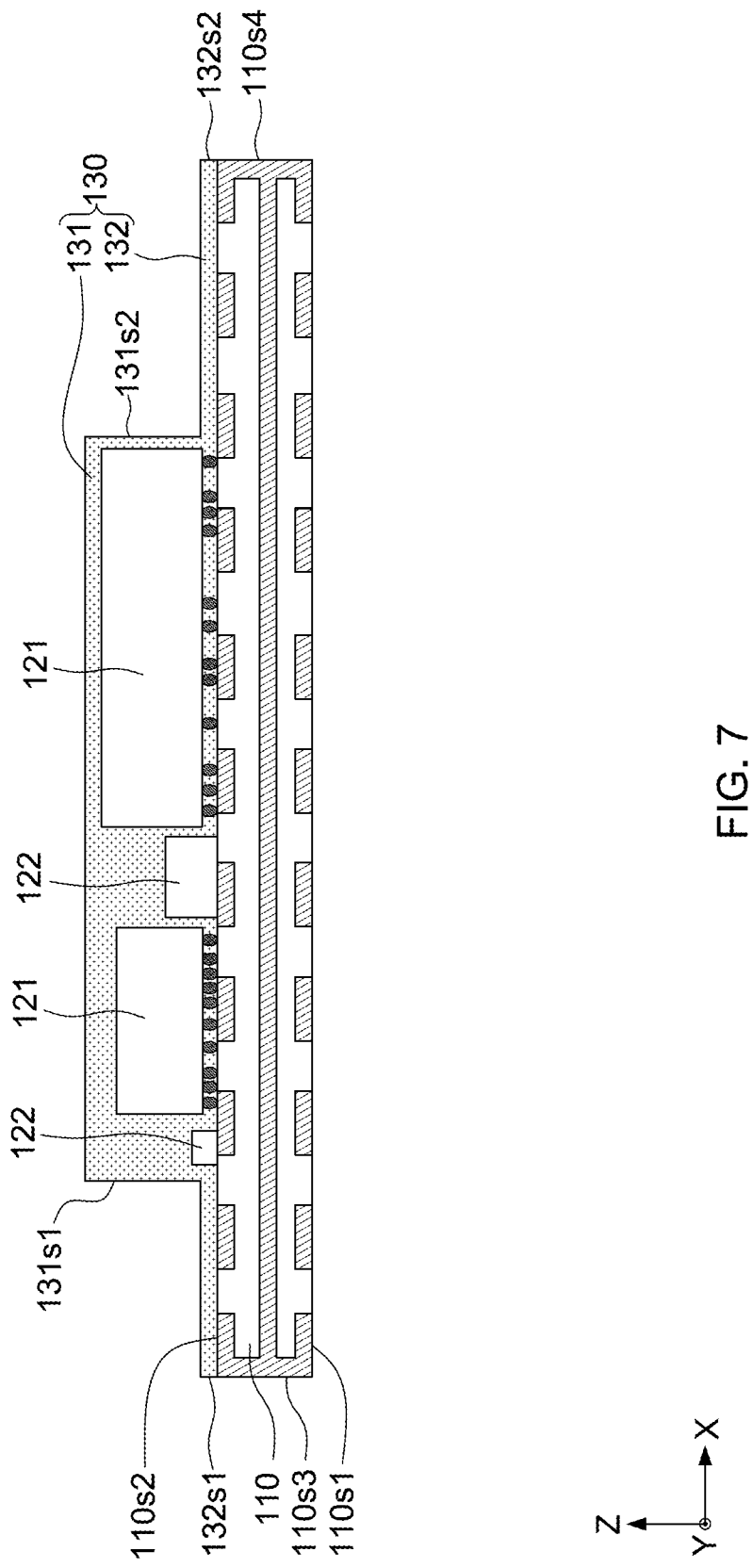

Referring to FIG. 7, the electronic component structure 10 is singulated along the scribe line 180, separating the units 11. In some embodiments, a saw (not shown) or the like is utilized to saw the carrier 110.

Figure 8:
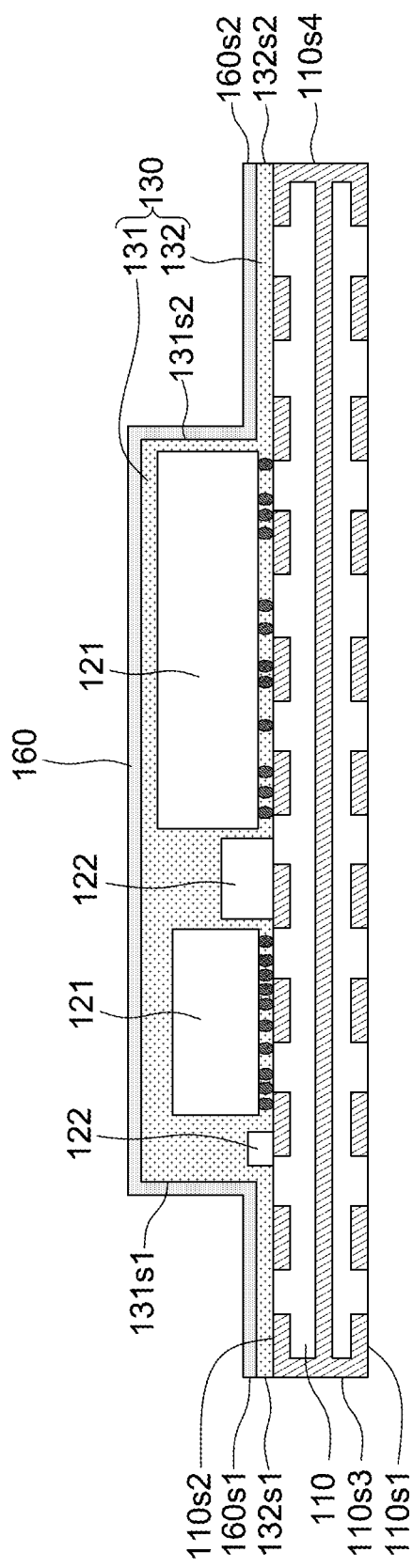

Referring to FIG. 8, the EMI shielding layer 160 may be formed on the encapsulant 130. The encapsulant 130 may be formed by, for example, sputtering or other suitable process. In some embodiments, multiple units 11 are attached to a supporter, such as a tape, before the formation of the EMI shielding layer 160. Next, conductive materials, such as metal, are deposited on the encapsulant 130 to form the EMI shielding layer 160.

Figure 9:
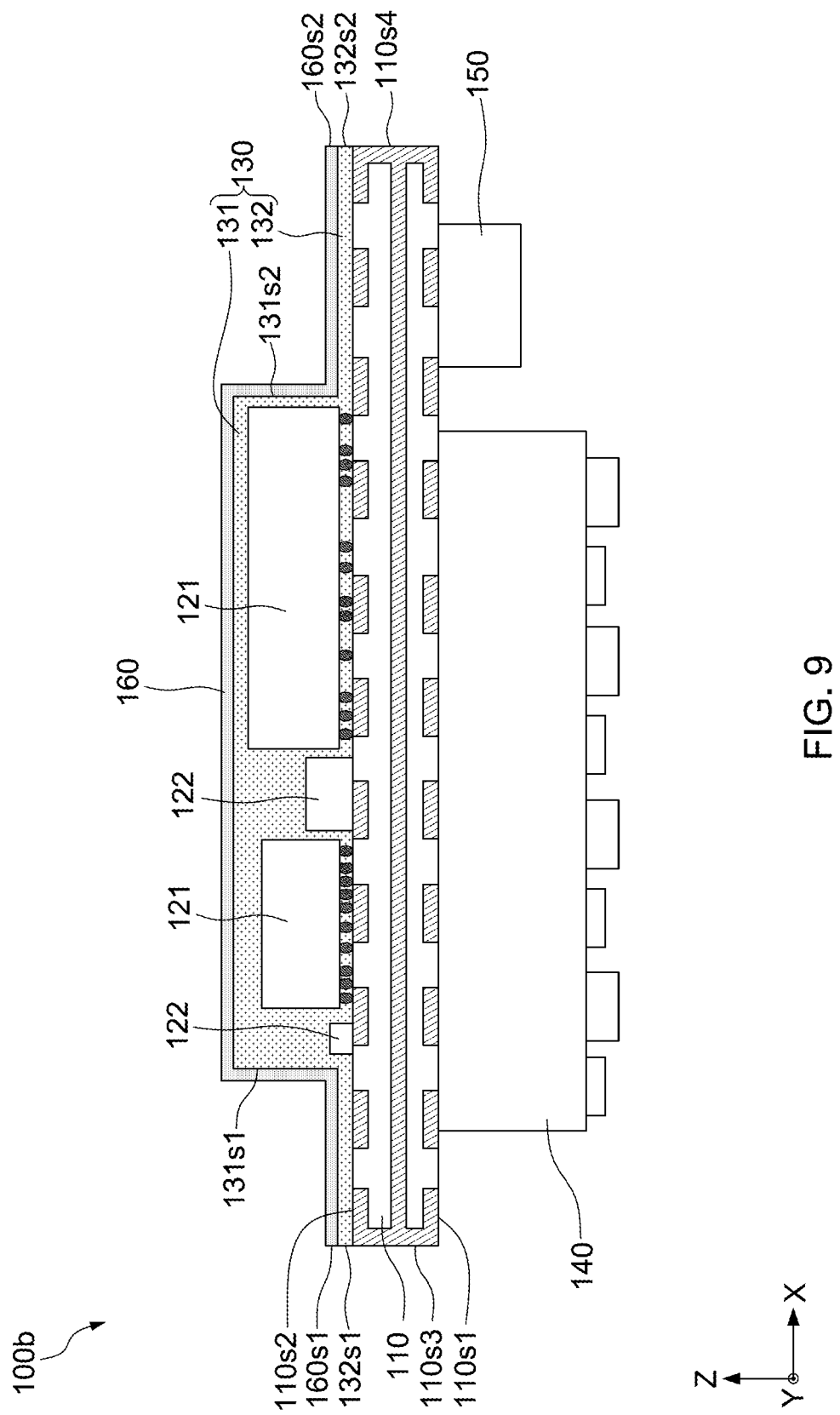

Referring to FIG. 9, the antenna component 140 and the connector 150 are mounted on the surface 110s1 of the carrier 110, thereby producing the electronic device 100b. In this embodiment, the portion 131 and the portion 132 of the encapsulant 130 may reduce warpage imposed on the carrier 110, rendering the antenna component 140 and the connector 150 mountable in a desired region of the carrier 110. Therefore, the performance of the electronic device 100b may be improved.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a carrier;
a first electronic component disposed over the carrier;
a second electronic component disposed over the carrier, wherein a top surface of the first electronic component has a height less than a height of a top surface of the second electronic component with respect to the carrier; and
an encapsulant encapsulating the first electronic component and the second electronic component, wherein a top surface of the encapsulant has a first region over the first electronic component, a second region over the second electronic component, and a third region outside the first region and the second region, and wherein a height of the first region is substantially equal to a height of the second region with respect to the carrier, and a height of the third region is less than the height of the first region with respect to the carrier; and
a device disposed under the carrier,
wherein the top surface of the encapsulant has a fourth region outside the first, second and third region of the top surface of the encapsulant, a height of the fourth region is less than the height of the first region with respect to the carrier, and in a cross-sectional view, a width of the third region is different from a width of the fourth region, and at least one of the third region and the fourth region does not vertically overlap the device.

2. The electronic device of claim 1, wherein the encapsulant has a first thickness defined by a vertical distance between the top surface of the encapsulant and a top surface of the first electronic component, a second thickness defined by a vertical distance between the top surface of the encapsulant and a top surface of the second electronic component, and a third thickness defined by a vertical distance between the top surface of the encapsulant and a top surface of the carrier, and wherein the first thickness of the encapsulant is greater than the third thickness of the encapsulant, or the second thickness of the encapsulant is greater than the third thickness of the encapsulant.

3. The electronic device of claim 1, comprising:
a device disposed under the carrier,
wherein the third region of the encapsulant has a first part vertically overlapping the device and a second part free from vertically overlapping the device.

4. The electronic device of claim 2, wherein a height difference between the first region and the third region of the encapsulant is greater than the third thickness of the encapsulant.

5. The electronic device of claim 4, further comprising:
a third electronic component between the first electronic component and the second electronic component in a side view or in a cross-sectional view, wherein the encapsulant has a fourth thickness defined by a vertical distance between the top surface of the encapsulant and a top surface of the third electronic component, and the fourth thickness of the encapsulant is greater than the first thickness and the second thickness of the encapsulant.

6. The electronic device of claim 5, further comprising:
a fourth electronic component, wherein the encapsulant has a fifth thickness defined by a vertical distance between the top surface of the encapsulant and a top surface of the fourth electronic component, and wherein the fifth thickness is greater than the first thickness, the second thickness, and the fourth thickness of the encapsulant.

7. An electronic device, comprising:
a carrier;
an encapsulant disposed over the carrier, wherein the encapsulant has a top surface which covers a first electronic component with a first thickness, a second electronic component with a second thickness, a third electronic component with a third thickness, and a fourth electronic component with a fourth thickness, and wherein the first thickness, the second thickness, the third thickness, and the fourth thickness are different from each other, and the top surface of the encapsulant is substantially flat in a cross-sectional view; and
a device disposed under the carrier, wherein a vertical projection of the device overlaps at least the first electronic component, the second electronic component, and the third electronic component, and wherein the first thickness is greater than the second thickness, and the second thickness is greater than the third thickness,
wherein the third electronic component is disposed between the first electronic component and the second electronic component in the cross-sectional view or in a side view, and a height of a top surface of the third electronic component is less than a height of a top surface of the first electronic component and a height of a top surface of the second electronic component with respect to the carrier.

8. The electronic device of claim 7, wherein the fourth electronic component is not disposed between the first electronic component and the second electronic component, and a height of a top surface of the fourth electronic component is less than the height of the top surface of the first electronic component, the height of the top surface of the second electronic component, and the height of the top surface of the third electronic component with respect to the carrier.

9. The electronic device of claim 8, wherein the carrier has a non-mounting area, and the fourth thickness of the fourth electronic component is greater than a thickness of the encapsulant over the non-mounting area of the carrier.

10. An electronic device, comprising:
a carrier; and
an encapsulant disposed over the carrier, wherein the encapsulant has a top surface which covers a first electronic component with a first thickness, a second electronic component with a second thickness, a third electronic component with a third thickness, and a fourth electronic component with a fourth thickness, and wherein the first thickness, the second thickness, the third thickness, and the fourth thickness are different from each other, and the top surface of the encapsulant is substantially flat in a cross-sectional view,
wherein the first electronic component and the second electronic component are arranged side by side, and in the cross-sectional view, a first distance between a first lateral surface of the first electronic component and a first lateral surface of the encapsulant adjacent to the first lateral surface of the first electronic component is less than a second distance between a second lateral surface of the second electronic component and a second lateral surface of the encapsulant adjacent to the second lateral surface of the second electronic component.

* * * * *